(12) United States Patent
Main et al.

(10) Patent No.: US 6,188,160 B1
(45) Date of Patent: Feb. 13, 2001

(54) SMART MATERIAL CONTROL SYSTEM AND RELATED METHOD

(75) Inventors: John A. Main; George C. Nelson, both of Lexington, KY (US)

(73) Assignee: University of Kentucky Research Foundation, Lexington, KY (US)

( * ) Notice: Under 35 U.S.C. 154(b), the term of this patent shall be extended for 0 days.

(21) Appl. No.: 09/152,236

(22) Filed: Sep. 11, 1998

Related U.S. Application Data

(60) Provisional application No. 60/058,633, filed on Sep. 12, 1997.

(51) Int. Cl.[7] .................................................. H01L 41/08
(52) U.S. Cl. ............................................. 310/314; 310/317
(58) Field of Search ..................................... 310/314, 317

(56) References Cited

U.S. PATENT DOCUMENTS

| | | |
|---|---|---|
| 3,662,355 | 5/1972 | Kazan . |
| 3,774,043 * | 11/1973 | Le Carvennec ........................ 250/330 |
| 3,886,527 | 5/1975 | Bert et al. ...................... 340/173 CR |
| 3,893,047 | 7/1975 | Lardat ................................. 333/30 R |
| 3,899,709 | 8/1975 | Brown et al. .......................... 313/369 |
| 3,903,364 | 9/1975 | Lean ....................................... 178/7.1 |
| 3,903,486 | 9/1975 | Bert et al. ............................ 333/30 R |
| 4,093,883 * | 6/1978 | Yamamoto ............................ 310/317 |
| 4,225,882 * | 9/1980 | Moiroud et al. ...................... 358/113 |
| 4,435,441 | 3/1984 | Mariani et al. ......................... 427/10 |
| 4,672,254 | 6/1987 | Dolat et al. ....................... 310/313 R |
| 5,159,498 * | 10/1992 | Hubbard, Jr. ......................... 359/847 |
| 5,382,864 | 1/1995 | Morikawa et al. ................... 310/332 |
| 5,515,725 | 5/1996 | Tabota et al. ...................... 73/574.34 |
| 5,869,189 * | 2/1999 | Hagood, IV et al. ............... 428/461 |

OTHER PUBLICATIONS

John A. Main, "Smart Material Control Without Wire Leads Or Electrodes: New Methods And Devices," Proceedings of DETC '97 ASME Design Eng. Technical Conferences, American Society of Mech. Eng., (Sep. 14, 1997).

Mark A. Ealey et al., "Deformable Mirrors: Design Fundamentals, Key Performance Specifications, and Parametric Trades," SPIE vol. 1543 Active and Adaptive Optical Components, SPIE, p. 36–51, Dec. 1991.

Bor–Tsuen Wang et al., "Laminate Plate Theory for Spatially Distributed Induced Strain Actuators," Journal of Composite Materials, Technomic Publishing Co., Inc., p. 433–453, (Apr., 1991).

A. V. Ikramov et al., "Bimorph adaptive mirror," Sov. J. Quantum Electron, American Institute of Physics, p. 163–166, (Feb., 1992).

(List continued on next page.)

Primary Examiner—Thomas M. Dougherty
(74) Attorney, Agent, or Firm—King & Schickli, PLLC

(57) ABSTRACT

A smart material control system and related method is disclosed for adaptively controlling the movement of an adaptive structure. The adaptive structure includes a smart material layer bonded to a conductive substrate in a bimorph configuration. A charge projector, such as an electron gun, is utilized to project charges onto the smart material layer of the adaptive structure. A voltage/charge source adaptively controls the potential of the conductive substrate. Depending on the placement of the projected charges and the adaptively controlled potential of the conductive substrate the displacement/curvature is precisely controlled. In an alternate embodiment, two smart material layers are bonded together to form an adaptive structure controlled independently in the x- and y- directions. Also, an array of charge projectors and/or conductive substrate sections may be used to provide varying and broad control of adaptive structures.

7 Claims, 2 Drawing Sheets

OTHER PUBLICATIONS

E.F. Crawley et al., "Induced Strain Actuation of Isotropic and Anisotropic Plates," AIAA Journal, vol. 29 (No. 6), p. 944–951, Jan. 1990.

C.K. Lee, "Theory of laminated piezoelectric plates for the design of distributed sensors/actuators. Part I: Governing equations and reciprocal relationships," J. Accoustical Society of America, p. 1145–1159, (Mar., 1990). vol. 87 No. 3.

F. Forbes et al., "Segmented bimorph deformable mirror," J. Phys. E: Sci. Instrum, IOP Publishing LTD, Dec. 1989.

Thomas Bailey et al., "Distributed Piezoelectric–Polymer Active Vibration Control of a Cantilever Beam," J. Guidance, vol. 8 (No. 5), p. 605–611, (Sep., 1985).

Takuso Sato et al., "Adaptive PVDF piezoelectric deformable mirror system," Optical Society of America, Applied Optics, vol. 19 (No. 9), p. 1430–1434, (May 1, 1980).

* cited by examiner

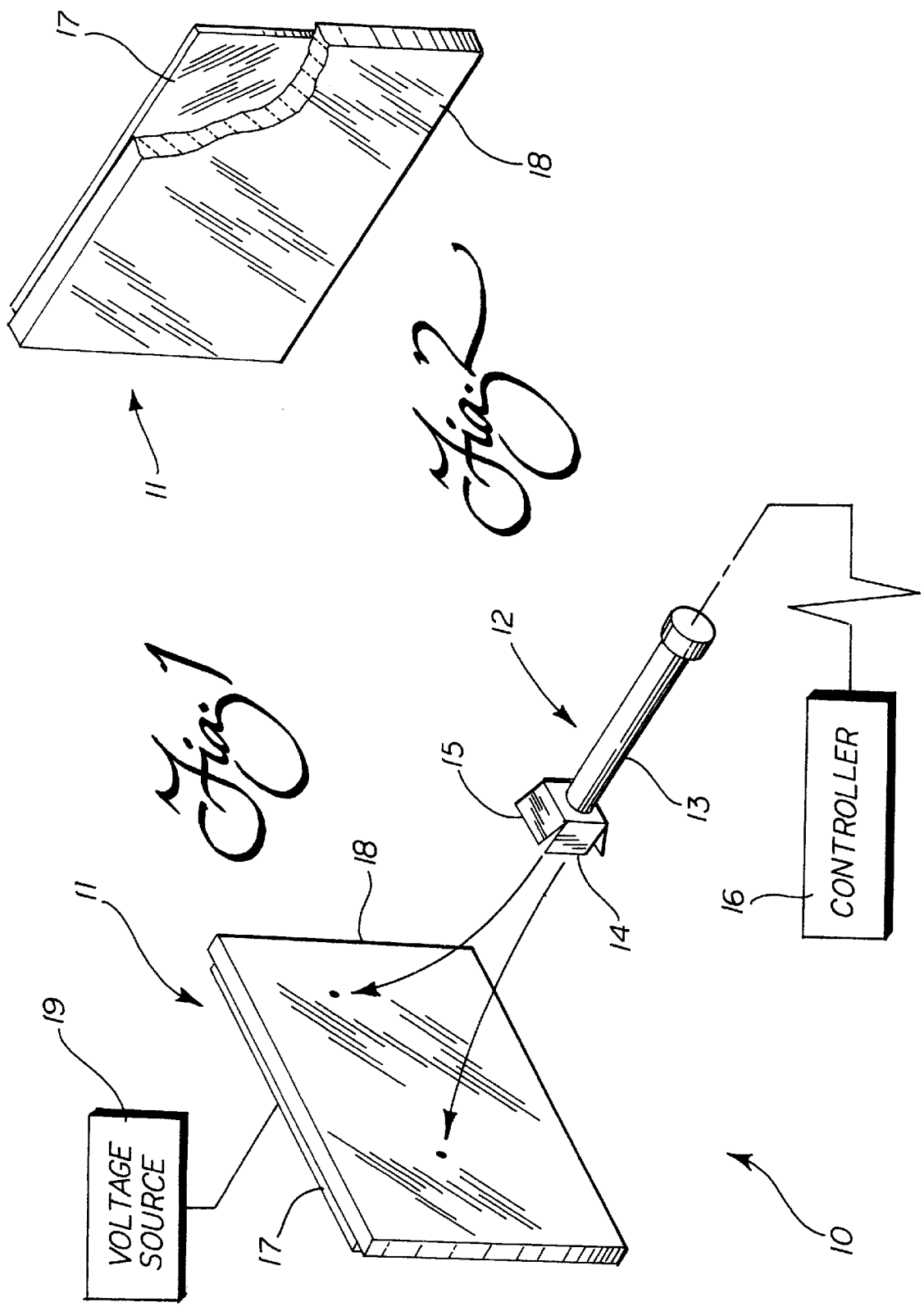

SMART MATERIAL CONTROL SYSTEM AND RELATED METHOD

This application claims the benefit of U.S. Provisional Application No. 60/058,633, filed Sept. 12, 1997.

TECHNICAL FIELD

The present invention relates generally to the control of adaptive structures and more particularly to a method and system for controlling the change in displacement and/or curvature of a smart material.

BACKGROUND OF THE INVENTION

Smart materials such as piezoelectrics, thermoelectrics, pyroelectrics, magnetostrictives and electrostrictives are finding increased utility in adaptive structures in both commercial and non-commercial applications. In fact, smart materials are presently being utilized as actuators in such diverse products as printers, speakers, sonar equipment, adaptive optics controls, aerodynamic controls, precision pointing instruments, and for noise suppression and vibrational damping applications. Smart materials are also utilized as sensors within accelerometers, microphones, sonar systems, and vibration controls and as disposable lighter spark generators among others. This increase in the utilization of smart materials in adaptive structures is primarily due to the fact that these materials provide for direct coupling between electrical and mechanical energy.

For example, the application of an electric field to a piezoelectric or similar smart material induces a mechanical strain in the material. This is generally known as the converse piezoelectric effect relied on by electromechanical actuators. By controlling the application of the electric field to the smart material, the displacement/curvature resulting from the induced strain can be predicted and used for selective positioning, or to apply a force. However, in order to take full advantage of the converse piezoelectric effect, new methods of applying and controlling the electric field are required.

Presently, distributed electrodes are the technology of choice utilized by system designers for applying an electric field to smart materials. A typical electromechanical actuator includes a smart material layer bonded on one side to a conductive substrate in a bimorph configuration. A distributed electrode is selectively positioned and bonded to the opposite side of the smart material layer. The conductive substrate is grounded and a voltage is applied through a wire lead to the distributed electrode, thus generating an electric field across the smart material layer. The voltage, in turn, induces strain in the smart material resulting in the desired displacement/curvature. Similarly, several electrodes of varying size and shape may be selectively placed in contact with the smart material for more precise or specific control of the displacement/curvature.

Despite achieving the desired result of controlled displacement and/or curvature, utilizing distributed electrodes and wire leads to apply an electric field to the smart material layer imposes several limitations on the system designer. First, the distribution of the electrodes, their size and shape must all be predetermined early in the design process dependent upon the desired spatial resolution.

This early predetermination is problematic because once selected these features are not readily adaptable to varying system demands or requirements. For example, if a shape adjustment/correction becomes necessary on a specific region of an adaptive structure, the electrode borders must completely envelope the limits of the region or the desired adjustment/correction is impossible to achieve and redesign may be required.

Another limitation inherent in the use of distributed electrodes is restricted or low spatial resolution. With regard to the bimorph actuator described above, for example, the size of the electrode(s) strictly defines the spatial resolution of the displacement/curvature control. In order to control the curvature of a one square meter bimorph actuator with a spatial resolution of one square centimeter, ten thousand separate electrodes and their attendant wire leads would be required. Obviously, this spatial resolution is both economically and fundamentally impractical to implement and thus, severely limits the utility of these actuator devices.

Therefore, an important aspect of the present invention is to provide an apparatus/method capable of adaptively controlling the displacement and/or curvature of an adaptive structure without concern for the distribution, size and shape of electrode(s). As a result, it is now possible to overcome the cited limitations of the prior art. In doing so it is also possible to attain much higher spatial resolutions down to the order of microns.

SUMMARY OF THE INVENTION

Accordingly, it is a primary object of the present invention to provide a system and related method for applying control signals to an adaptive structure which include concepts and features that are designed to overcome the limitations of the prior art.

It is another object of the present invention to provide a system and related method for applying control signals to an adaptive structure which provides for greater operational flexibility in controlling the displacement and/or curvature of the structure.

Yet another object of the present invention is to provide a system/method of applying control signals to an adaptive structure utilizing a charge projector capable of projecting a focused electron beam onto the surface of the structure, thus providing much higher spatial resolution down to the micron level.

Another object of the present invention is to provide a system and related method for adaptively controlling the displacement of an adaptive structure by projecting electron charges onto a surface of the structure and varying the potential of a conductive substrate bonded to an opposite surface of the structure, thus providing improved system linearity and greater stability margins than heretofore realized.

Still yet another object of the present invention is to provide a system/method for adaptively controlling the curvature of an adaptive structure having opposingly polarized smart material layers by projecting electron charges onto a surface of the structure and varying the potential of a conductive substrate bonded to an opposite surface of the structure.

It is another object of the present invention to provide a system/method for adaptively controlling the displacement and/or curvature of an adaptive structure utilizing more than one charge projector to independently control segregated areas of the adaptive structure.

Still another object of the present invention is to provide a system/method for adaptively controlling the displacement and/or curvature of an adaptive structure utilizing a single-energy charge projector.

Yet another object of the present invention is to provide a system/method for adaptively controlling the displacement and/or curvature of an adaptive structure having perpendicularly polarized smart material layers.

Additional objects, advantages, and other novel features of the invention will be set forth in part in the description that follows and in part will become apparent to those skilled in the art upon examination of the following or may be learned with the practice of the invention. The objects and advantages of the invention may be realized and attained by means of the instrumentalities and combinations particularly pointed out in the appended claims.

To achieve the foregoing and other objects, and in accordance with the purposes of the present invention as described herein, there is provided an improved system for controlling the movement of an adaptive structure. In particular, a charge projector, such as an electron gun, an ion gun or the like is utilized to project charges onto a first surface of the adaptive structure. More specifically, charges are projected onto a first surface of a smart material layer. A second opposite surface of the smart material layer is bonded to a conductive substrate, for controlling bulk strains or changes in the dimensions of the adaptive structure. Alternately, the smart material layer may comprise two smart material layers having opposing polarizations in a bimorph configuration bonded to the conductive substrate for controlling the curvature of the adaptive structure. The utilization of a charge projector eliminates many of the limitations inherent in the use of electrodes. Specifically, control of the adaptive structure is no longer dependent upon the size, shape and distribution of electrodes. Instead, these features are integrated into the control signal processing of the charge projector. This is due to the ability of the charge projector to control and direct the charges distributing them in any desired pattern on the surface of the adaptive structure.

Advantageously, each individual point on the surface of the smart material layer of the structure effectively becomes an actuator location which can be individually and adaptively controlled by the precise placement of charges by the charge projector. Thus, subject only to the limitations of the adaptive structure dimensions and signal processing capabilities of the controller, the charge projector can actuate any point/surface area desired by the controller. This unique ability greatly enhances the overall spatial resolution of the system.

In accordance with an important aspect of the present invention, the smart material layer acts as a dielectric which accumulates a net surface charge upon application of the projected charges. As will be described in greater detail below, this net surface charge provides the control system with the ability to apply net positive or net negative charges to the individual points/surface areas of the smart material layer. Advantageously, this allows for even more precision in the control of the displacement and/or curvature of each point of the adaptive structure.

More specifically, a voltage or charge source can be used to control the potential of the conductive substrate. In this manner, the secondary electron yield resulting from the energy of the projected charges contacting the smart material layer can be adaptively controlled to stimulate a more precise strain in the smart material layer. Advantageously, controlling the potential of the conductive substrate in this manner allows for the use of less expensive and lighter single-energy charge projectors to close the current loop at a particular location in the smart material layer and effectively eliminate the potential side effects associated with varying the energy of the electron beam to control net secondary electron yield.

In accordance with another important aspect of the present invention, it is possible to control adaptive structure and particularly, smart material layer curvatures independently in the x- and y- directions. This may be realized by laminating together two smart material layers in a bimorph configuration which provides unidirectional piezoelectric effects in directions opposite or perpendicular to one another. For the opposing piezoelectric effect adaptive structure, the strain induced by the piezoelectric effect causes a contraction in the first smart material layer and an expansion in the second smart material layer. Overall, the adaptive structure maintains a substantially uniform thickness due to the opposing changes in the thickness of the two smart material layers. For the perpendicular piezoelectric effect bimorph configuration, on the other hand, the strain-induced by the piezoelectric effect in the first smart material layer is transformed into a bending moment when it is restrained by the relatively inert reaction of the second smart material layer.

The application of appropriate charge distributions to the individual smart material layers is preferably accomplished by forming a four layer adaptive structure. The first layer is a smart material layer, the second a conductive layer, the third a second smart material layer with the piezoelectric effects perpendicular to the first, and the fourth is a second conductive layer. The two conductive layers are electrically connected to each other and a voltage or charge source. The application of appropriate charge distributions to the individual smart material layers is preferably accomplished by perforating the first smart material and conductive layers. Thus, when the electron beam is focused upon and strikes the first smart material layer, curvature changes occur in a first direction and when the electron beam is focused upon and strikes the inner or second smart material layer, curvature changes occur in the second direction. Alternatively, depolarized areas in either layer are used to limit the piezoelectric effects to the remaining layer.

Still other objects of the present invention will become readily apparent to those skilled in this art from the following description wherein there is shown and described a preferred embodiment of this invention, simply by way of illustration of one of the modes best suited to carry out the invention. As it will be realized, the invention is capable of other different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrates several aspects of the present invention, and together, with the description serve to explain the primary principles of the invention. In the drawings:

FIG. 1 is a perspective view of the system including a charge projector projecting charges onto the surface of an adaptive structure;

FIG. 2 is a partially cutaway, perspective view of an adaptive structure;

DETAILED DESCRIPTION OF THE INVENTION

Figure 3A:
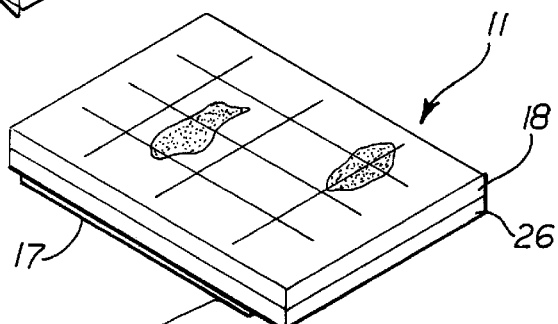
FIGS. 3A–3C are perspective views showing the displacement/curvature of adaptive structures having varying degrees of charge accumulation on their respective surfaces.

Reference will now be made in detail to the present preferred embodiment of the invention, an example of which is illustrated in the accompanying drawings.

Reference is now made to the perspective view of FIG. 1 showing a control system 10 for controlling the movement of an adaptive structure 11. A charge projector 12 projects charges onto a first surface of the adaptive structure 11. In the preferred embodiment of the present invention, the charge projector 12 is formed by an electron gun 13 and two pairs of deflector plates 14, 15 positioned at right angles to each other. The electron gun 13 operates to accelerate electrons or electron charges emitted from a hot filament or cathode to a series of electrodes or an anode. In addition to accelerating the charges, the electron gun 13 focuses the electron beam. This focused electron beam passes through the two pairs of deflection plates 14, 15. The deflection plates 14, 15 consist of oppositely charged conductors which produce an electric field in the horizontal and vertical directions, respectively. By varying the magnitude and direction of the fields between the plates, both the vertical and horizontal direction of the electron beam can be controlled.

As further shown in block schematic format in FIG. 1, a controller 16 controls the electron gun 13 and deflection plate pairs 14, 15. Depending upon the desired spatial resolution and location of charges to be projected onto the adaptive structure 11, the controller 16 varies the focus of the electron beam, the number of electrons reaching the anode and the magnitude and direction of the electric fields between the deflector plate pairs 14, 15.

As shown in FIG. 2, the adaptive structure 11 includes a conductive substrate layer 17 bonded with an epoxy generally known in the art to a smart material layer 18. In this configuration, bulk strains or changes in the dimensions of the adaptive structure 11 are controlled. In the most preferred embodiment, a second smart material layer 26 having an opposing polarization relative the first smart material layer 18 is added to the adaptive structure 11 in a bimorph configuration and further allows for the curvature of the adaptive structure 11 to be controlled as show in FIGS. 3A–3C. Materials which have as common property that function in a manner to be used as the smart material layer 18 are piezoelectrics, electrostrictives, and magnetostrictives. Specifically, each of these smart materials provide direct coupling between electrical energy and mechanical energy. In other words, when an electric or magnetic field is applied to the material a mechanical strain is generated. This strain is a direct result of the accumulated charge on the surface of the smart material layer and the adaptively controlled potential of the conductive substrate layer 17.

It should also be appreciated that it is possible to use a charge projector such as an electron gun to apply a charge distribution to materials which couple electrical energy with other types of energy. Two examples of such materials are pyroelectrics and thermoelectrics which couple electrical energy and heat energy.

Figure 4:
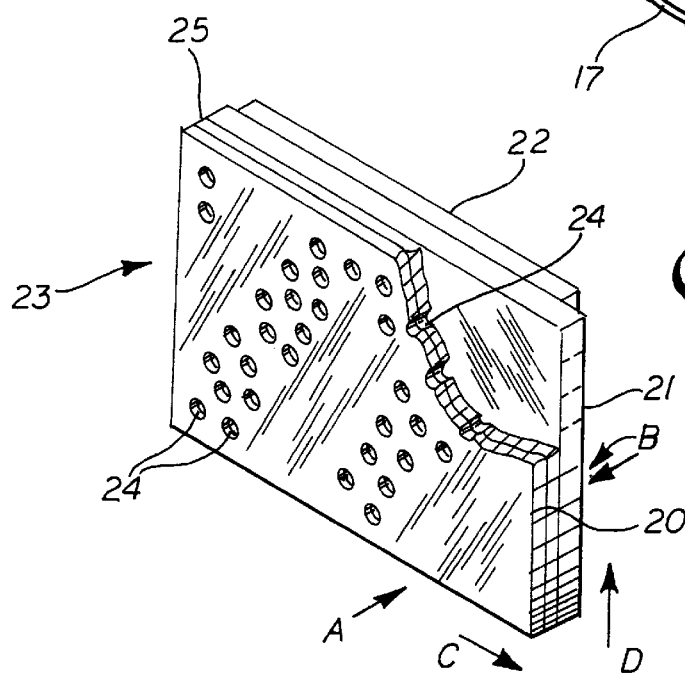
FIG. 4 is a partially cutaway, perspective view of an alternate embodiment of the adaptive structure including two smart material layers and two conductive substrate layers.

In an alternate embodiment of the present invention, the adaptive structures and particularly, the smart material layer curvatures are independently controlled in the x- and y-directions. As shown in FIG. 4, this may be realized by bonding two smart material layers 20, 21 (e.g. two layers of polyvinylidine fluoride) to two conductive substrate layers 22, 25 to form an adaptive structure 23 in bimorph configurations which provides unidirectional piezoelectric effects in directions opposite (shown by directional arrows A, B) or perpendicular (shown by directional arrows C, D) to one another. Thus, for the opposing piezoelectric effect adaptive structure 23, the induced strain causes a contraction in the first smart material layer 20 and an expansion in the second smart material layer 21. Overall, the adaptive structure 23 maintains a substantially uniform thickness due to the opposing changes in the thickness of the two smart material layers 20, 21. The adaptive structure 23 further maintains substantially identical x- and y- coordinates due to the opposing changes of the two smart material layers 20, 21. For the perpendicular piezoelectric effect bimorph configuration, the strain-induced by the piezoelectric effect in the first smart material layer 20 is transformed into a bending moment when it is restrained by the relatively inert reaction of the second smart material layer 21.

The application of appropriate charge distributions to the individual smart material layers 20, 21 is accomplished by perforating the first smart material layer 20 and first conductive substrate layer 25. Thus, when the electron beam is focused upon and strikes the first smart material layer 20, curvature changes occur in a first direction and when the electron beam is focused upon and strikes the inner or second smart material layer 21, curvature changes occur in a second direction. In the alternate embodiment of the present invention, perforations 24 are substantially 5 to 50 micrometers in diameter. It is contemplated that further alternate embodiments could include depolarized regions in the outer or first smart material layer 20. These regions would generally serve the same purpose as the above mentioned perforations 24. Specifically, the depolarized regions would be similar in size to the perforations 24 and would allow curvature to be stimulated in one direction only.

The effects of piezoelectricity in the preferred embodiment of the present invention are represented linearly in the piezoelectric constitutive equations $$S = s^E T + dE \tag{a}$$

$$S = s^D T + gD \tag{b}$$

where T is stress, S is strain, E is electric field, and D is the electric displacement.

The equation used most often in piezoelectric material control is equation (a), generally known as the electric field relationship or actuator equation. This is the appropriate relationship when field or voltage is the control quantity.

The charge projector 12 of the present invention advantageously provides the capability to control charge distribution, as opposed to voltage. The appropriate control equation for charge projector controlled piezoelectric materials, for example, is equation (b). This is the electric displacement equation, or the sensor equation. This equation is used for charge control of piezoelectric materials since the electric displacement is related to the surface charge by the relationship $$D = Q/A \tag{c}$$

where Q is the charge applied over a surface area A. The fact that the present invention utilizes charge control is beneficial due to the fact that charge control of piezoelectric materials has been demonstrated to be more linear than voltage control, which most certainly leads to improved performance and more robust systems.

As shown in the preferred embodiment of the present invention illustrated in FIG. 1, the potential of the conductive substrate layer 17 is variably controlled by a voltage source 19. In the preferred embodiment, the voltage source 19 is a charge controlled amplifier. Alternatively, a voltage controlled amplifier could be used. By varying the potential of the conductive substrate layer 17, as opposed to simply grounding the layer 17 as employed in prior art applications, a single-energy charge projector 12 may be utilized to vary the electric field between the surface of layer 18 and the conductive substrate layer 17. Advantageously, the single-energy charge projector 12 significantly reduces the size and overall weight of the system. In addition, the overall complexity of the system including the charge projector controller 16 and necessary algorithms are significantly reduced. In their place, a more readily controlled charge or voltage source 19 may be utilized to vary the potential of the conductive substrate layer 17.

In operation, the charge projector 12 initially establishes a secondary electron yield substantially equal to one on the smart material layer 18. Thus, by varying the potential of the conductive substrate layer 17 the secondary electron yield can be precisely controlled to stimulate a controllable strain without having to adjust the energy of the charge projector.

Figure 3B:
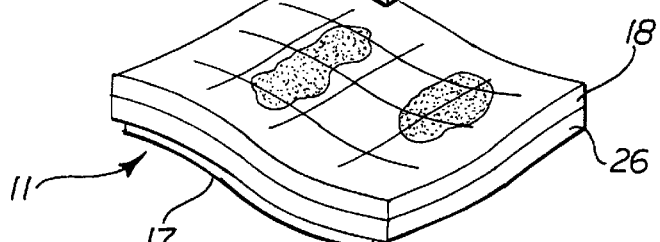
Figure 3C:
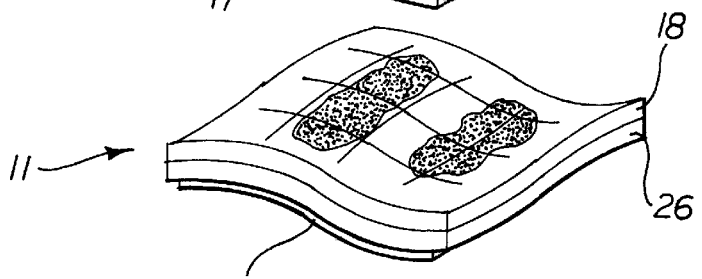

As shown in FIGS. 3A–3C, the displacement and/or curvature of the adaptive structure in the most preferred embodiment is dependent upon the placement of charges projected onto the smart material layer 18 and the adaptively controlled potential of the conductive substrate layer 17. In fact, the smart material layer 18 acts as a dielectric which accumulates a net surface charge upon application of the projected charges. The effect on the accumulation of surface charge resulting from the collision of an electron with the surface of a smart material is not as simple as the addition of one electron-sized negative charge. An electron is decelerated when it impacts a surface, giving up its kinetic energy to the material. A number of things can happen to that energy, including raising the energy levels of other electrons to the point that they are ejected from the surface. These electrons are known as secondary electrons. The number of secondary electrons emitted from a surface due to the impact of a single electron is a function of the energy of the incident electron.

The presence of the secondary electron effect gives systems utilizing charge control the ability to apply net positive and/or net negative charges to the surface of a smart material. If the charge projector 12 emits electrons with energies that cause an electron yield greater than one, this causes a net positive charge to accumulate on the smart material layer. The opposite effect is observed when the incident electrons have energies such that the yield is less than one. Advantageously, this allows for more precise control of the movement of each point of the adaptive structure.

From the above, it will now be realized that substantial results and advantages are obtained by the method and corresponding system for adaptively controlling the displacement and/or curvature of an adaptive structure 11. An adaptive structure 11 is formed by bonding a conductive substrate 17 to a smart material layer 18 alone or in combination with a second smart material layer 26 in a bimorph configuration. A charge projector 12 is utilized to project charges onto the surface of the adaptive structure 11 and a voltage source 19 is utilized to adaptively control the potential of the conductive substrate layer 17, thereby precisely controlling the electric field and the displacement/curvature of the smart material layer 18. Advantageously, this method and system may be utilized in a number of applications including but not limited to active acoustic panels, high resolution micromanipulators, adaptive optics and in radar diffusing panels for stealth aircraft.

The foregoing description of a preferred embodiment of the invention has been presented for purposes of illustration and description. It is not intended to be exhaustive or to limit the invention to the precise form disclosed. Obvious modifications or variations are possible in light of the above teachings. For example, an array of charge projectors may be utilized to provide varying control of an adaptive structure or control of a large adaptive structure. Additionally, an array of charge projectors and/or conductive substrate sections may be used to provide varying and broad control of adaptive structures.

The preferred embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A system for controlling movement of an adaptive structure comprising:

an adaptive structure having first, second, third, and fourth layers, said first and second layers having a plurality of perforations;

a charge projector for projecting charges onto said first layer and through said perforations and onto said third layer of said adaptive structure, whereby the movement of said first and third layers of said adaptive structure is independently controllable.

2. The system for controlling the movement of an adaptive structure of claim 1, wherein said first and third layers are smart material layers and said second and fourth layers are conductive substrates, said layers bonded together in a multimorph configuration.

3. The system for controlling the movement of an adaptive structure of claim 2 further comprising a voltage/charge source for selectively varying the potential of said second and fourth layers of said adaptive structure; and wherein said charge projector is a single energy electron gun.

4. A system for controlling the movement of an adaptive structure comprising:

an adaptive structure having first and second smart material layers, and a conductive substrate layer, wherein said first and second smart material layers are arranged such that polarities of said first and second smart material layers are opposing;

a charge projector for projecting charges onto said first layer of said adaptive structure; and a variable voltage/charge source for selectively varying the potential of said conductive substrate layer of said adaptive structure, whereby the displacement and/or curvature of said adaptive structure is dependent upon the placement of said charges and the potential of said conductive substrate layer of said adaptive structure.

5. The system for controlling the movement of an adaptive structure of claim 4, wherein said voltage/charge source for selectively varying the potential of said conductive substrate layer is an amplifier and said charge projector includes at least one single energy electron gun.

6. A method of controlling an adaptive structure bonded to a conductive substrate layer having a potential/charge comprising the steps of:

projecting charges onto a first smart material layer of said adaptive structure, said adaptive structure having first and second smart material layers arranged such that polarities of said first and second smart material layers are opposing;

selectively varying the potential/charge of said conductive substrate layer; and wherein the displacement and/or curvature of said adaptive structure is dependent upon both the placement of said projected charges and the potential/charge on said conductive substrate layer.

7. The method of adaptively controlling an adaptive structure of claim 6 wherein the step of varying the potential/charge includes selectively polarizing said conductive substrate layer in order to shorten the time required to effect the displacement and/or curvature of said adaptive structure.

\* \* \* \* \*